United States Patent [19]
Oh

[11] Patent Number: 5,960,011
[45] Date of Patent: Sep. 28, 1999

[54] VITERBI DECODER

[75] Inventor: Dae-Il Oh, Kyounggi-do, Rep. of Korea

[73] Assignee: Hyundai Electrinics Ind. Co., Ltd., Kyounggi-do, Rep. of Korea

[21] Appl. No.: 09/159,636

[22] Filed: Sep. 24, 1998

Related U.S. Application Data

[62] Division of application No. 08/672,076, Jun. 26, 1996, Pat. No. 5,859,861.

[30] Foreign Application Priority Data

| Jun. 30, 1995 | [KR] | Rep. of Korea | 95/18785 |
| Jun. 30, 1995 | [KR] | Rep. of Korea | 95/18786 |
| Jun. 30, 1995 | [KR] | Rep. of Korea | 95/18808 |
| Sep. 21, 1995 | [KR] | Rep. of Korea | 95/31224 |

[51] Int. Cl.$^6$ .................. G06F 11/10; H03M 13/12
[52] U.S. Cl. .................. 371/46; 371/43.7; 371/43.8; 375/262; 375/341; 375/354
[58] Field of Search .................. 371/43.6, 43.7, 371/43.8, 46; 375/260, 262, 341, 354, 365, 371; 340/146.2, 825.3

[56] References Cited

U.S. PATENT DOCUMENTS

| 4,240,156 | 12/1980 | Doland | 371/43.7 |
| 4,578,800 | 3/1986 | Yasuda et al. | 375/354 |
| 4,641,327 | 2/1987 | Wei | 375/365 |
| 4,777,636 | 10/1988 | Yamashita et al. | 371/43.7 |
| 4,802,174 | 1/1989 | Hiraiwa et al. | 371/46 |
| 4,823,346 | 4/1989 | Kobayashi et al. | 371/43.6 |
| 5,050,191 | 9/1991 | No | 375/341 |
| 5,295,142 | 3/1994 | Hatakeyama | 371/43.6 |
| 5,390,198 | 2/1995 | Higgins | 371/43.8 |
| 5,408,502 | 4/1995 | How | 375/340 |
| 5,418,795 | 5/1995 | Itakura et al. | 371/30 |
| 5,710,784 | 1/1998 | Kindred et al. | 375/262 |

*Primary Examiner*—Emmanuel L. Moise
*Attorney, Agent, or Firm*—Whitham, Curtis & Whitham

[57] ABSTRACT

A viterbi decoder includes a maximum branch metric value detecting device separated from a feedback loop consisting of an ACS arithmetic unit, a normalization arithmetic unit, and a state value storing device. In operation, a maximum branch metric value is detected by utilizing the output of the state value storing device, to thereby enhance operating speed. Further, a judgment is made as to whether a state having the minimum state value at an immediately preceding time is back-traceable from a state having the minimum state value at a current time by using survivor path information. Non-back-traceable non-correspondences are then detected, and the number of occurrences of non-correspondences are counted. If the occurrences of non-correspondences exceed a reference value, it is judged a non-synchronization. In another method, synchronization/non-synchronization is judged by detecting whether a trace back is possible, without utilizing survivor path information.

6 Claims, 16 Drawing Sheets

VITERBI DECODER

This application is a divisional application of application Ser. No. 08/672,076, filed Jun. 26, 1996, now U.S. Pat. No. 5,859,861 the subject matter of which is incorporated herein by reference.

BACKGROUND OF THE INVENTION

1. Field of the invention

The present invention relates to a Viterbi decoder, and particularly to a Viterbi decoder which belongs to a forward error correction method which is used for error controls for digital data transmission.

2. Description of the prior art

The Viterbi decoding algorithm was developed in 1967, and is an optimum decoding method for carrying out the maximum likelihood decoding. However, it is difficult to construct its hardware.

The Viterbi decoder is described in: (1) "The Viterbi Algorithm" by G. D. Forney, Proc. IEEE, vol. 61, No. 3, pp 268–278, March 1970; (2) "High Speed Parallel Viterbi Decoding: algorithm and VLSI-architecture" by G. Fettweis and H. Meuer, IEEE Comm., pp 46–55, May 1991; (3) Japanese Patent Laid-open Publication No. Sho-59-19454; and (4) U.S. Pat. No. 5,295,142.

By taking an example of a convolution encoder, a simple Viterbi decoding algorithm will be described below, where the code rate is R=1/2, the constraint length is K=3, and the generating polynomial is as follows:

$$G1 = 1 + X + X^2$$

$$G2 = 1 + X^2$$

As shown in FIG. 1, the convolution encoder includes: a 2-bit shift register 1; and two adders 2 for carrying out modulo-2 additions. Outputs G1 and G2 of the encoder are decided by the state of the content of the shift register and by an input 3. Its outputs over time points are illustrated in the form of a trellis diagram in FIG. 2.

Referring to FIG. 2, the respective states are each joined by two paths, and the Viterbi algorithm selects only one of the two paths, which has a possibility, while the path having no possibility is discarded. In this manner, the maximum likelihood decoding is carried out. The path thus selected is called a survivor path, and the respective states maintain the information of the survivor paths as much as the decision depth (or truncation depth).

The decoding is carried out by selecting the greatest possibility path from among the survivor paths, and by tracing it back.

When constructing the viterbi decoder, the hardware (e.g., register) which constitutes the state value storing device cannot be enlarged to an infinite size, and an ACS (add-compare-select) arithmetic unit which computes the state values of the respective states repeatedly operates at each hour. Therefore, a data overflow can occur by exceeding the storing capacity of the state value storing device, and therefore, errors can be generated in the decoded output.

In order to prevent such errors, a normalization arithmetic unit for resealing the state values becomes necessary. The Viterbi decoder which has such a function is illustrated in FIG. 3.

Input codes which are inputted into an input terminal 31 are inputted into a branch metric arithmetic unit 32 in which the branch metrics are based on the respective branches 00, 01, 10, and 11.

An ACS (add-compare-select) arithmetic unit 33 receives the output of the branch metric arithmetic unit 32 and the state values of the total time points of the state value storing device 34, so as to compute the survivor paths and the state values. The arithmetic operation of the ACS arithmetic unit 33 is carried out based on the trellis diagram of FIG. 2.

Of the output of the ACS arithmetic unit 33, the information on the survivor paths is stored in a path storing device 37, while the state values are outputted to a normalization arithmetic unit 35 and to a maximum branch metric value detecting device 36.

From the state values received from the ACS arithmetic unit 33, the maximum branch metric value detecting device 36 detects the maximum branch metric value so as to supply the maximum branch metric value to the normalization arithmetic unit 35, while the address of the maximum branch metric value is outputted to a traceback control device 38 so as to control the path storing device 37.

The normalization arithmetic unit 35 subtracts the maximum branch metric values of the maximum branch metric value detecting device 36 from the survivor state values of the respective state of the ACS arithmetic unit 33. The computed result is stored into the state value storing device 34.

Therefore, the state values which are stored in the state value storing device 34 are as follows. That is, the maximum branch metric values (e.g., the smallest state value) are always subtracted from the current time output of the ACS arithmetic unit 33, before storing it. Therefore, a data overflow cannot occur, and one of the state values which are stored in the state value storing device is necessarily zero.

However, in the above described Viterbi decoder, during the time when computing the branch metric for the inputted codes until the time when the new state values are stored in the state value storing device 34, the arithmetic process passes through: the ACS arithmetic unit 33, the maximum branch metric value detecting device 36, and the normalization arithmetic unit 35. Therefore, this poses as an impediment in embodying a high speed Viterbi decoder.

As an example of the conventional techniques for improving the operating speed, a Viterbi decoder was proposed in which, in the normalization process, the maximum branch metric value of the preceding time points is used instead of the maximum branch metric value of the current time, thereby shortening the arithmetic path.

However, in this Viterbi decoder, a relatively complicated hardware is required for detecting the address of the state having the maximum branch metric value. Further, the arithmetic path which is connected from the ACS arithmetic unit to the maximum branch metric value detecting device imposes an impediment all the same.

Another Viterbi decoder was proposed, and in this decoder, the disadvantage of the above described Viterbi decoder was alleviated by normalizing through the use of the maximum branch metric value of the current time. Thus one of the normalized state values which are stored in the state value storing device becomes necessarily zero, thereby improving the operating speed.

However, in this Viterbi decoder, the complicated arithmetic paths become an impediment in the way of improving the operating speed.

If the normalization operation is carried out without using the maximum branch metric value, the maximum branch metric value detecting device can be separated from the arithmetic path consisting of the speed deciding devices such as the ACS arithmetic unit 33, the maximum branch metric value detecting device 36 and the normalization arithmetic unit 35. Generally, the maximum branch metric value detecting device consists of a multi-step comparator, and therefore, the operating speed of the Viterbi decoder can be improved by separating the maximum branch metric value detecting device.

If the received convolution-coded codes are to be decoded by using the Viterbi algorithm, then a synchronization has to be established between the transmitting part and the receiving part. Particularly in an application field in which separate frame synchronizing signals are not used, the Viterbi decoder has to detect the synchronization/non-synchronization for itself based on the received signals, thereby executing the decoding.

The state values increase in time, and the increasing patterns of the state values become different depending on the environment of the transmission path. In the case where a code synchronization is established between the transmitting part and the receiving part, the higher the signal-to-noise ratio Eb/No (where Eb is signal, and No is noise), the smaller the increasing rate of the state values in time becomes. Further, there exists a dominant state in which the state value is far smaller than other state values. On the other hand, the lower the signal-to-noise ratio, the larger the increasing rate of the state values in time. Further, the respective state values are similar to each other. In the case where no synchronization is formed between the transmitting part and the receiving part, the state value increasing patterns are similar to the case where the signal-to-noise ratio is very low.

In the Viterbi decoder which forms a Viterbi algorithm, the state values are stored in a register having a size of 6 or 7 bits, and therefore, in order to prevent a data overflow, a normalization (or rescaling) is required.

Generally, in carrying out the normalization, the minimum value of the state values exceeds a threshold value, the threshold value is subtracted from the state values.

FIG. 4 illustrates a conventional Viterbi decoder (U.S. Pat. No. 4,802,174).

In this Viterbi decoder, the frequency of carrying out the normalization is measured for a certain period of time, and if the frequency is higher than a threshold frequency, then it is judged that there is no code synchronization between the transmitting part and the receiving part.

In this Viterbi decoder, of the branch metrics which are computed by a branch metric arithmetic unit 41, the minimum value is extracted, and then, a branch metric normalization is carried out by subtracting the minimum value from the respective branch metrics, thereby improving the accuracy of the detection of the synchronization/non-synchronization. However, this Viterbi decoder needs a separate branch metric normalization arithmetic unit 42, and therefore, the cost for the hardware is increased.

As another example, in the Wei method (U.S. Pat. No. 4,641,327), the number of occurrences [d(t) equals non-zero] which is equivalent to the difference between the minimum state value PMmin(t) and the minimum branch metric BMmin(t) is measured for a certain period of time, and the obtained value is compared with a reference value, thereby detecting the synchronization/non-synchronization. However, in this method, a reference value cannot be determined which is capable of precisely detecting the synchronization/non-synchronization without the information on the signal-to-noise ratio.

A Viterbi decoder which improves the Wei method (U.S. Pat. No. 4,641,327) is disclosed in U.S. Pat. No. 5,050,191. In this Viterbi decoder, the synchronization/non-synchronization is detected by means of a measured value of f{d(t)} which is a non-linear function of d(t) which is the difference between the minimum state value PMmin(t) and the minimum branch metric BMmin(t). If d(t)=0, f{d(t)} is accumulated, while if d(t) is non-zero, f{d(t)}=−1 is accumulated. Then the accumulated values are compared with a reference value, thereby detecting the synchronization/non-synchronization. In this method however, there are required an adder for accumulating the values of f{d(t)}, and a comparator for comparing the two reference values. Therefore, this method has the disadvantage that the hardware cost is increased.

The synchronization/non-synchronization detecting method which is proposed in the present invention can be applied to a puncturing convolution encoding technique. The mentioned synchronization/non-synchronization detecting method is as follows. That is, an observation is made for a certain period of time as to whether a traceback is possible from a state having the minimum state value at the immediately preceding time and having the minimum state value at the current time by utilizing the information on the survivor paths, thereby detecting the synchronization/non-synchronization.

The puncturing convolution encoding technique makes it possible to form a Viterbi decoder for high code rate codes, and makes it possible to form a simple encoder/decoder which is capable of selecting the code rate.

If the puncturing codes are to be accurately decoded, a puncturing pattern synchronization has to be established between the transmitting part and the receiving part. However, the information on the puncture pattern synchronization is not transmitted, and therefore, the Viterbi decoder itself has to detect the puncture pattern synchronization based on the received codes so as to execute the decoding.

LSI Logic company adopted a method for detecting the puncture pattern synchronization in the following manner. That is, the bit error rate in the output of the Viterbi decoder in the puncture pattern non-synchronization status is higher than the puncture pattern synchronization status, and by utilizing this fact, the puncture pattern synchronization/non-synchronization is detected. The method the LSI Logic company had the disadvantage that the cost for hardware is increased due to the use of a convolution encoder and a buffer.

SUMMARY OF THE INVENTION

The present invention is intended to overcome the above described disadvantages of the conventional techniques.

Therefore it is an object of the present invention to provide a Viterbi decoder in which the hardware is simplified, and the operating speed is improved.

It is another object of the present invention to provide a synchronization/non-synchronization detecting apparatus for the Viterbi decoder and a method therefor, in which the code synchronization/non-synchronization between the transmitting part and the receiving part can be precisely detected, and the hardware cost is saved.

In achieving the above objects, the apparatus according to the present invention is characterized in that a maximum branch metric value detecting device is separated from a feedback loop consisting of an ACS arithmetic unit, a normalization arithmetic unit and a state value storing device, or from a feedback loop consisting of an ACS arithmetic unit and a state value storing device, and that the maximum branch metric value is detected by utilizing the output of the state value storing device, thereby improving the operating speed of the Viterbi decoder.

Further, in achieving the above objects, the method according to the present invention is characterized in that a judgment is made as to whether a traceback is possible from a state having the minimum state value at the immediately preceding time and having the minimum state value at the current time by utilizing the information on the survivor paths, and that a judgment is made as to whether there is non-correspondence incapable of traceback so as to measure the number of occurrences the non-correspondences for a certain period of time, and so as to decide the non-synchronization when the occurrences exceed a reference value.

In another method according to the present invention, a judgment is made as to whether a traceback is possible without using a survivor path information, thereby deciding the synchronization/non-synchronization.

In achieving the above objects, the synchronization/non-synchronization detecting apparatus according to the present invention is characterized in that an address information having the minimum state value at the immediately preceding time is stored in a register, then a survivor path information and an address information of a state having the minimum state value at the current time are compared with the address information of the state value having the minimum value at the immediately preceding time by using a comparator, then the number of occurrences of non-correspondences is counted for a certain period of time by using a counter, and then, the counted value of the counter is compared with a reference value, thereby detecting the synchronization/non-synchronization.

In another aspect, the synchronization/non-synchronization detecting apparatus according to the present invention is characterized in that an address information of a state having the minimum state value at the current time is compared with an address information having the minimum state value at the preceding time by means of a comparator, thereby carrying out the detection like in the above mentioned apparatus.

In still another aspect, the puncture pattern synchronization/non-synchronization detecting method is characterized in that a judgment is made as to whether the state having the minimum state value at the preceding time corresponds with a state obtained through a traceback from the state having the minimum state value at the current time by utilizing the survivor path information, then the correspondence/non-correspondence is judged based on the traceback possibility/traceback non-possibility, then the number of correspondence/non-correspondence is measured for only the case of $Xi=Yi=1$ of the puncture pattern, and then, the number of the occurrences are compared with a reference value, thereby detecting the synchronization/non-synchronization.

In still another aspect, the puncture pattern synchronization/non-synchronization detecting method is characterized in that an address information of a state having the minimum state value at the current time is compared with an address information of a state having the minimum state value at the preceding time by means of a comparator, and then, a detection is made in the above described manner.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
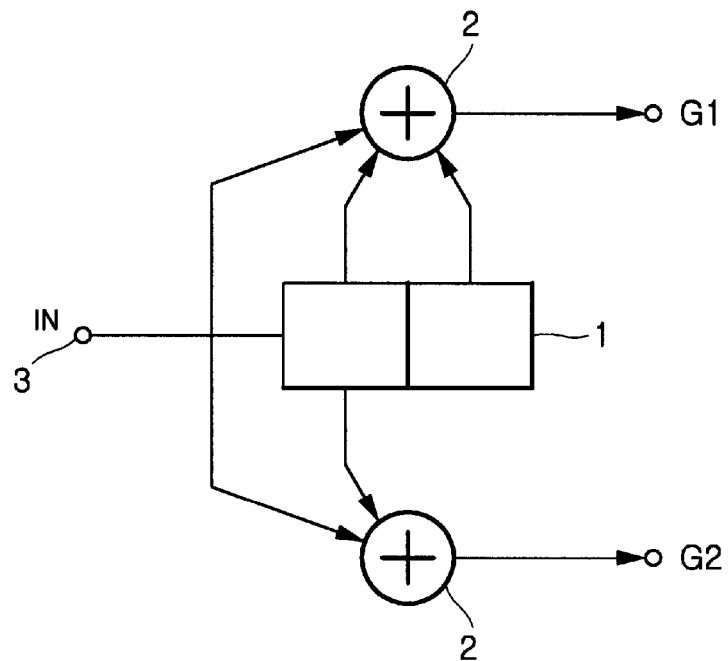
FIG. 1 illustrates the general convolution encoder.
Figure 2:
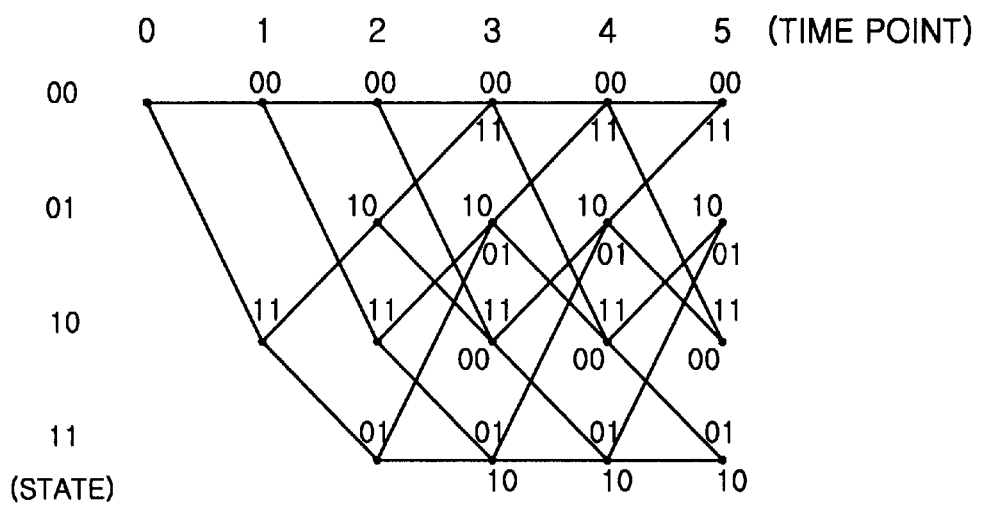
FIG. 2 is a trellis diagram showing a convolution encoder.
Figure 3:
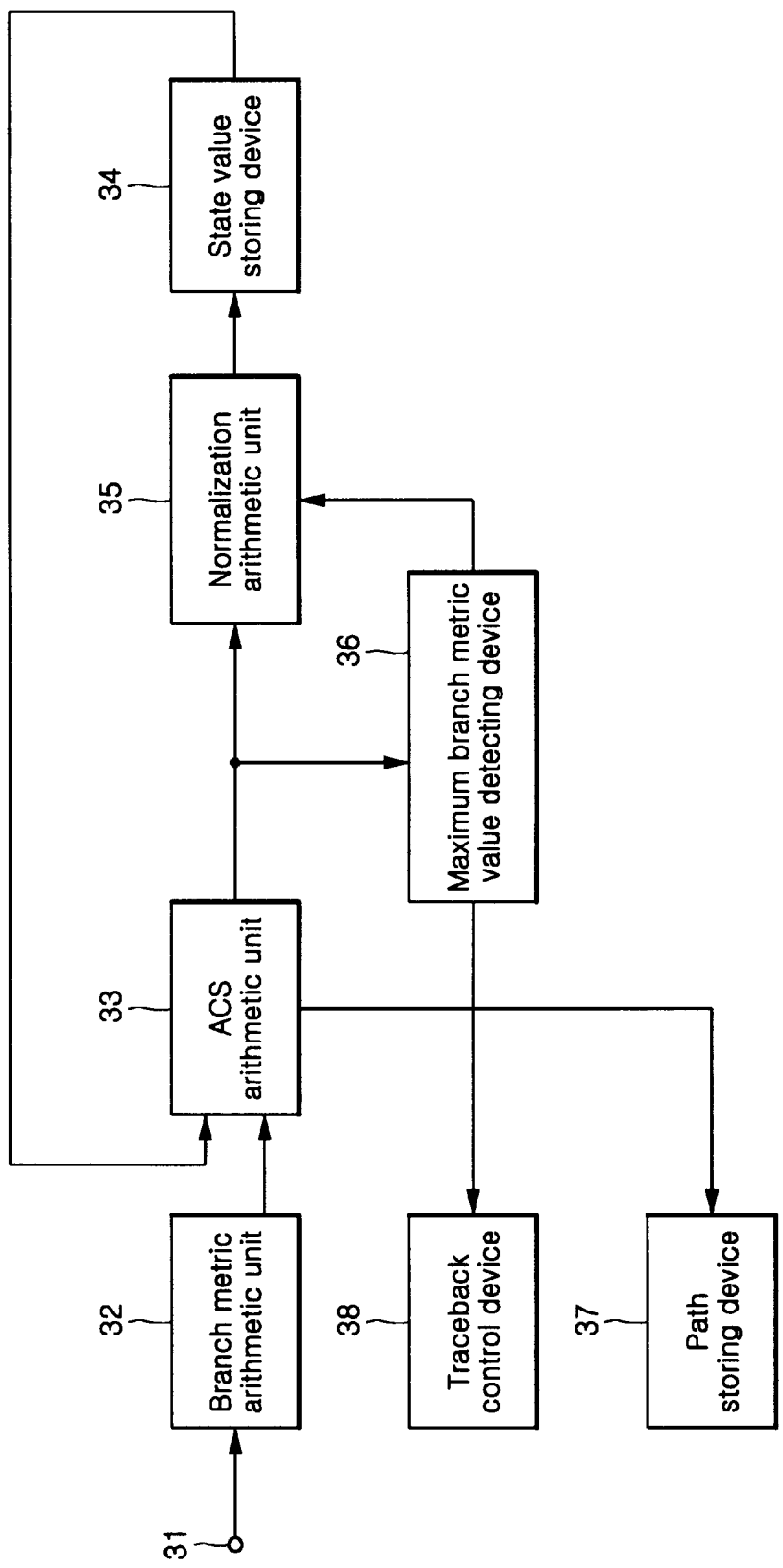
FIG. 3 is a block diagram showing the constitution of a conventional Viterbi decoder.
Figure 4:
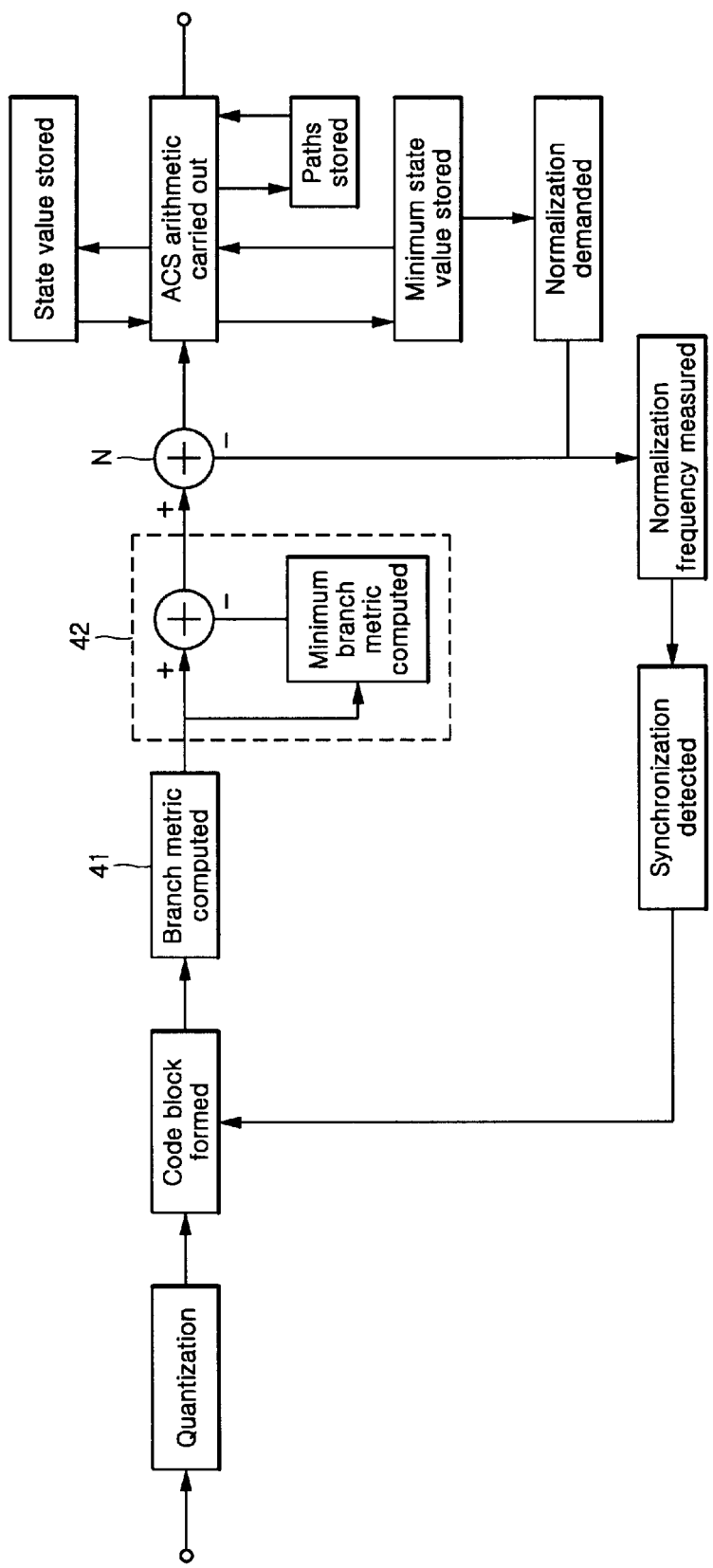
FIG. 4 illustrates a flow chart for the conventional Viterbi decoder.
Figure 5:
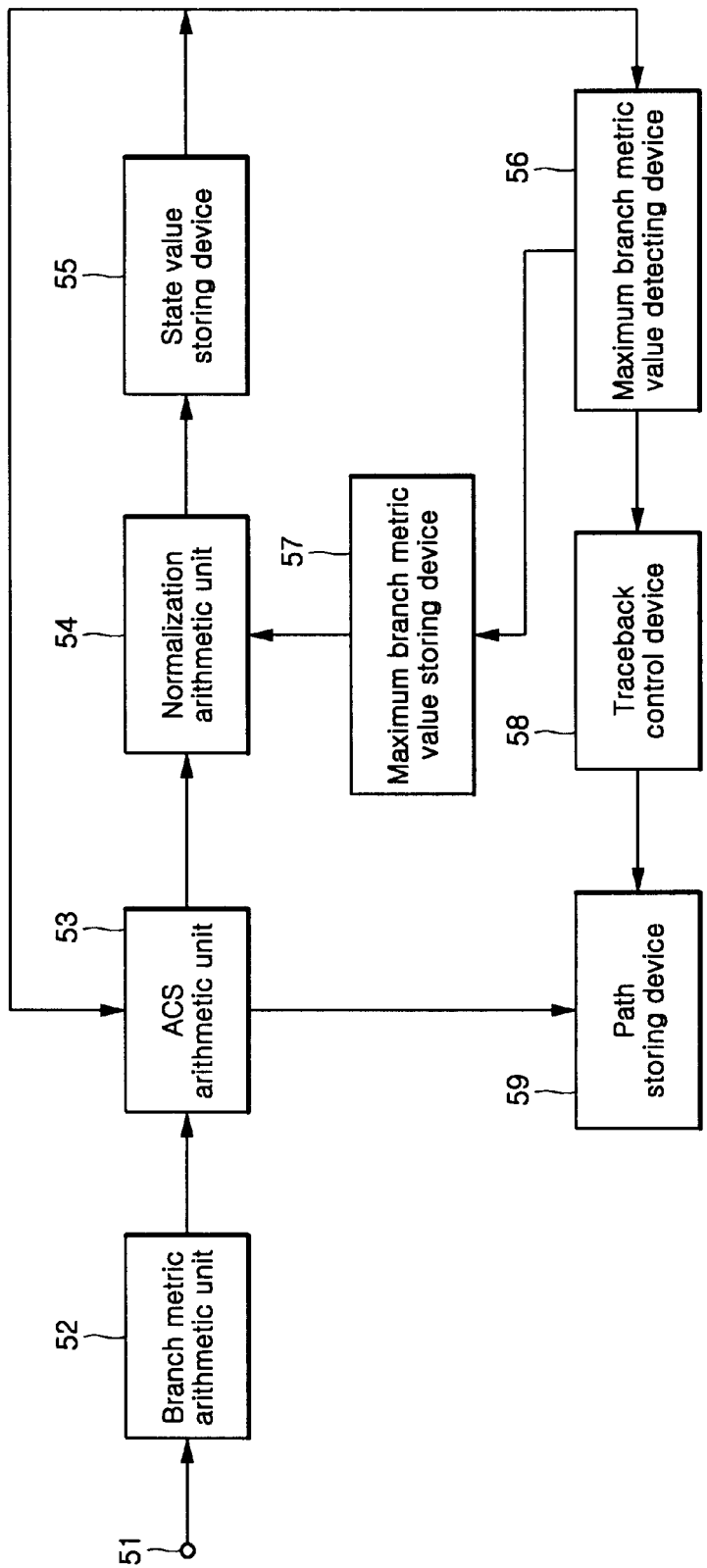
FIG. 5 is a block diagram showing the constitution of the Viterbi decoder according to the present invention.

FIG. 5 is a block diagram showing the constitution of the Viterbi decoder according to the present invention.

The Viterbi decoder according to the present invention includes: a branch metric arithmetic unit 52 for computing the branch metrics of signals inputted from an input terminal 51; an ACS arithmetic unit 53 for computing state values and a survivor path information; a path storing device 59 for storing an output survivor path information of the ACS arithmetic unit 53; a normalization arithmetic unit for normalizing the state values by utilizing the maximum branch metric values and the state values of the ACS arithmetic unit 53; a state value storing device 55 for storing an output state value of the normalization arithmetic unit 54; a maximum branch metric value detecting device 56 for detecting the maximum branch metric value from an output of the state value storing device 55; a maximum branch metric value storing device 57 for storing an output maximum branch metric value of the maximum branch metric value detecting device 56; and a traceback control device 58 for receiving an output maximum branch metric value of the maximum branch metric value detecting device 56 to control the path storing device 59 so as to execute a traceback.

In the above described apparatus, the received code data are inputted from the input terminal 51 to the branch metric arithmetic unit 52 which compute the branch metrics, and the computed branch metrics are inputted into the ACS arithmetic unit 53.

The ACS arithmetic unit 53 receives the branch metrics from the branch metric arithmetic unit 52 and the state values of the preceding time points from the state value storing device 55 so as to compute the state values and the survivor path information of the current time. The survivor path information which is outputted from the ACS arithmetic unit 53 is stored in the path storing device 59, while the state values are inputted into the normalization arithmetic unit 54.

In order to prevent a state value data overflow, the normalization arithmetic unit 54 executes a normalization operation by utilizing the state values of the ACS arithmetic unit 53, and by utilizing the maximum branch metric values of the maximum branch metric value storing device 57. Then the normalized state values are outputted to the state value storing device 55.

The state value storing device 55 stores the normalized state values of the normalization arithmetic unit 54, and the output of the state value storing device 55 is inputted into the ACS arithmetic unit 53 so as to be used in computing the survivor path information of the respective state and the state values of the survivors. Further, the output of the state value storing device 55 is inputted into the maximum branch metric value detecting device 56 so as to be used in detecting the maximum branch metric value.

The maximum branch metric value storing device 57 which receives the maximum branch metric value from the maximum branch metric value detecting device 56 receives the maximum branch metric value of the preceding time, and outputs it to the normalization arithmetic unit 54 so as for it to undergo a normalization operation.

Further, the maximum branch metric value which has been detected by the maximum branch metric value detecting device 56 is outputted to the traceback control device 56. Then the traceback control device 58 controls the path storing device 59 by utilizing an address having the maximum branch metric value, so that the path storing device 59 would output decoded data.

Under this condition, the maximum branch metric value detecting device 56 receives and uses the output of the state value storing device 55 instead of the output of the ACS arithmetic unit 53. Therefore, there is a difference of one cycle between the survivor path information (which is inputted from the ACS arithmetic unit 53 to the path storing device 59) and the address of the state having the maximum branch metric value (which is inputted from the maximum branch metric value detecting device 56 to the traceback control device 58). In order to compensate this difference, either a memory is installed within the path storing device 59, or a memory is disposed between the ACS arithmetic unit 53 and the path storing device 59.

Figure 6:
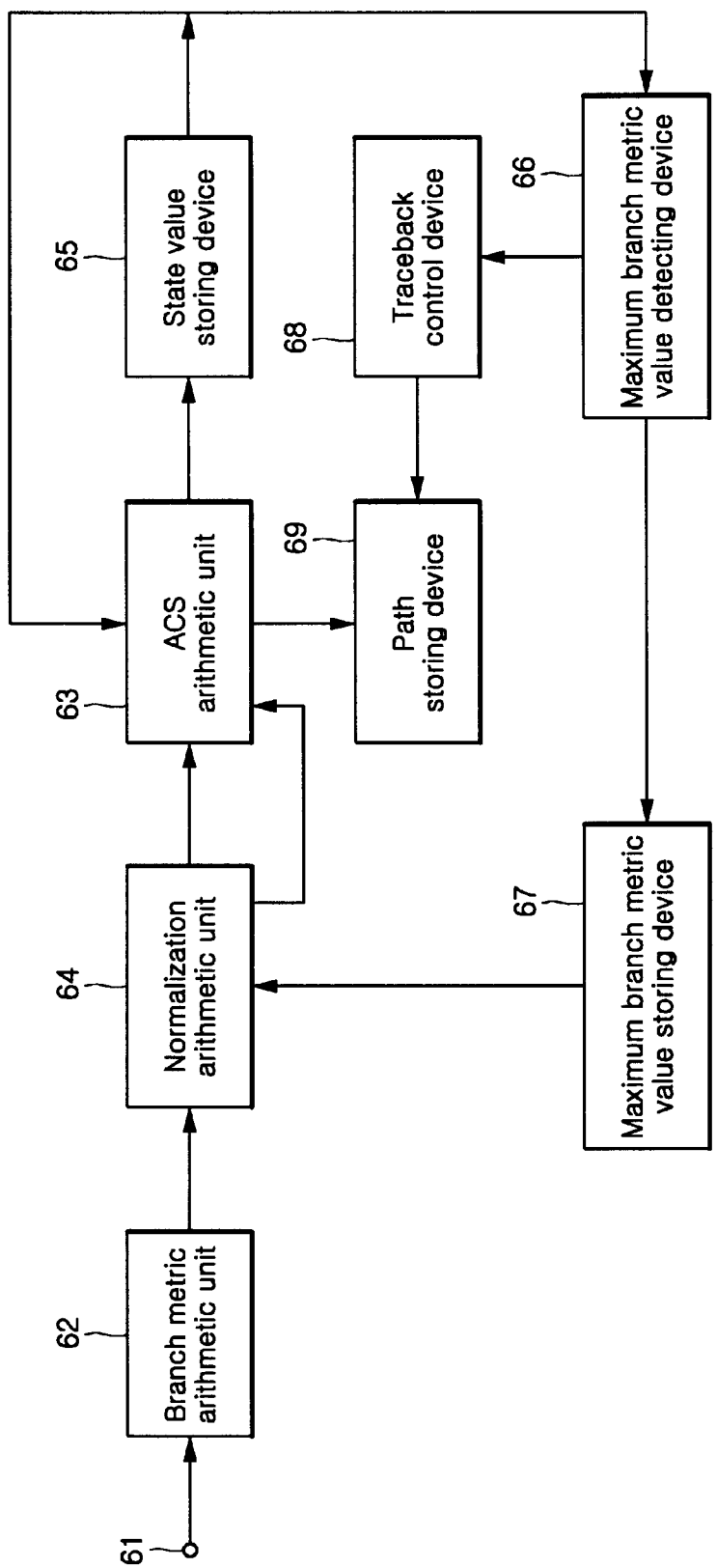
FIG. 6 illustrates another embodiment of the present invention.

Another embodiment of the present invention is illustrated in FIG. 6.

In the apparatus of this embodiment, the output of a branch metric arithmetic unit 62 is inputted into a normalization arithmetic unit 64. An ACS arithmetic unit 63 executes a normalization operation by utilizing a branch metric of the normalization arithmetic unit 64 and by utilizing the maximum branch metric value (of the preceding time) of a state value storing device 65, so as to output the survivor path information to a path storing device 69, and so as to output the state value to the state value storing device 65. The rest of the features of this embodiment are same as that of the apparatus of FIG. 5.

The normalization operation in which the maximum branch metric value is not utilized is carried out in the following manner. That is, in the case where the minimum value of the survivor state values exceeds a predetermined threshold value, the threshold value is subtracted from the all the survivor stated values. The Viterbi decoder of this type detects that the minimum value of the survivor state values has exceeded a predetermined threshold value so as to demand a normalization of the survivor state values. That is, such a normalization demanding device is required.

Figure 7:
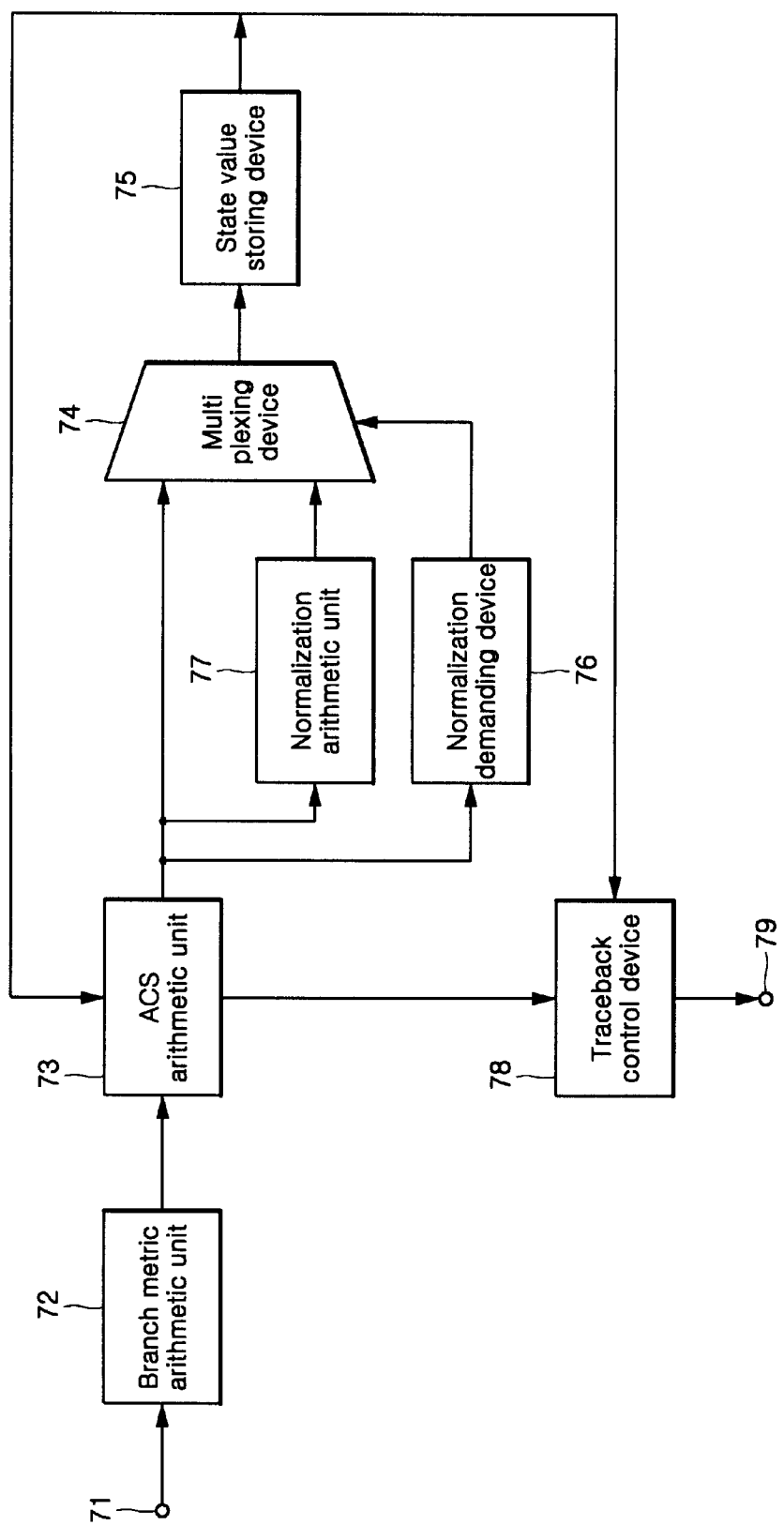
FIG. 7 is a block diagram showing the Viterbi decoder including a normalization demanding device as still another embodiment of the present invention.

FIG. 7 is a block diagram showing the Viterbi decoder including a normalization demanding device as still another embodiment of the present invention.

The operating speed of the Viterbi decoder of FIG. 7 is decided by the arithmetic speed of a arithmetic path consisting of: an ACS arithmetic unit 73, a normalization arithmetic demanding device 76, a normalization arithmetic unit 77, and a multiplexer 74.

Figure 8:
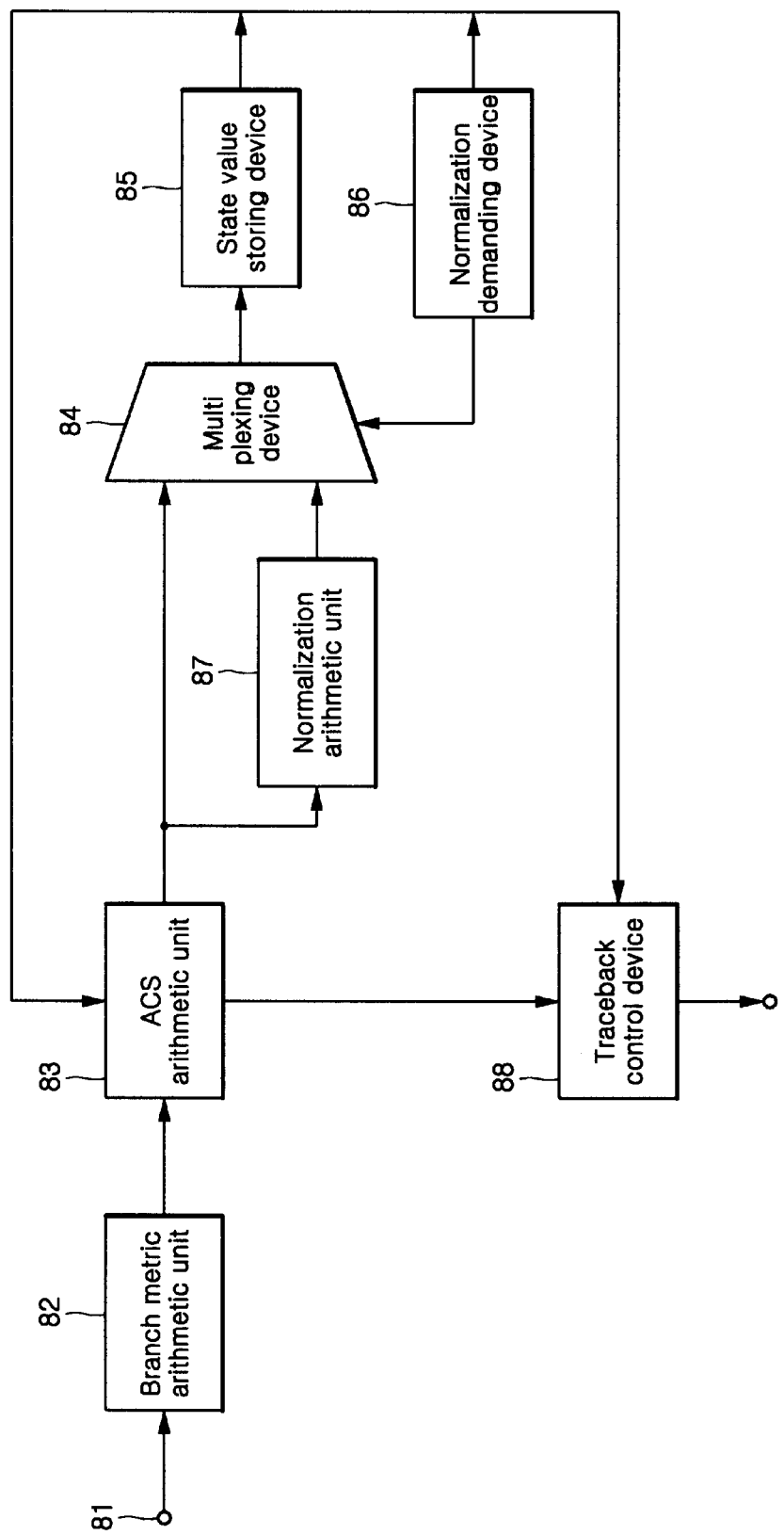
FIG. 8 is a block diagram showing the Viterbi decoder with the normalization demanding device separated from the arithmetic route.

In order to improve the operating speed of the Viterbi decoder constituted as described above, FIG. 8 illustrates a Viterbi decoder in which a normalization arithmetic demanding device is separated from the arithmetic path consisting of: an ACS arithmetic unit 73, a normalization arithmetic unit 76, and a multiplexer 74.

In this decoder, a normalization arithmetic demanding device 86 is separated from the above mentioned arithmetic path to utilize the output of a state value storing device 85. The operating speed of this type is determined by the operating speed of an arithmetic path consisting of: an ACS arithmetic unit 83, a normalization arithmetic unit 86, and a multiplexer 84. Therefore, the normalization arithmetic unit 87 and the multiplexer 84 pose as an impediment in the way of improving the operating speed of the Viterbi decoder.

Figure 9:
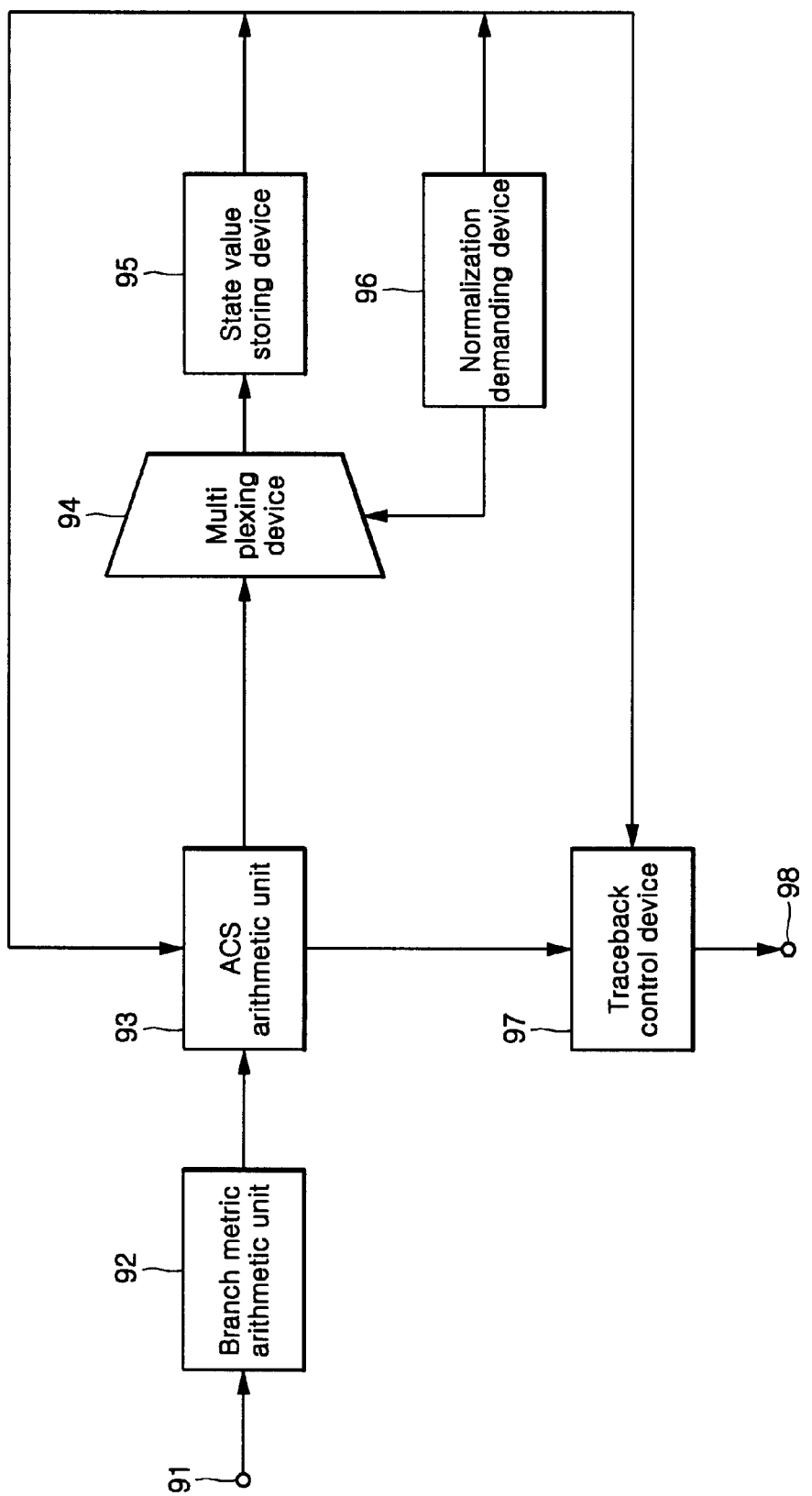
FIG. 9 illustrates still another embodiment of the Viterbi decoder according to the present invention.

FIG. 9 illustrates still another embodiment of the Viterbi decoder according to the present invention.

A code matrix is inputted into an input terminal 91 so as for it to undergo an arithmetic operation by a branch metric arithmetic unit 92, and the computed branch metrics are inputted into an ACS arithmetic unit 93.

The ACS arithmetic unit 93 receives the branch metrics from the branch metric arithmetic unit 92 and the preceding time state values from a state value storing device 95, to compute the state values and the survivor path information of the current time. The ACS arithmetic unit 93 includes ACS arithmetic members, and each member includes: two adders, one comparator, and one multiplexer. Meanwhile, the survivor path information which is outputted from the ACS arithmetic unit 93 is stored in a traceback device 97, and the state values are outputted to a multiplexer device 94.

The multiplexer device 94 simultaneously executes the normalization and selection. The multiplexer device 94 includes multiplexers as many as the number of the states.

Figure 10:
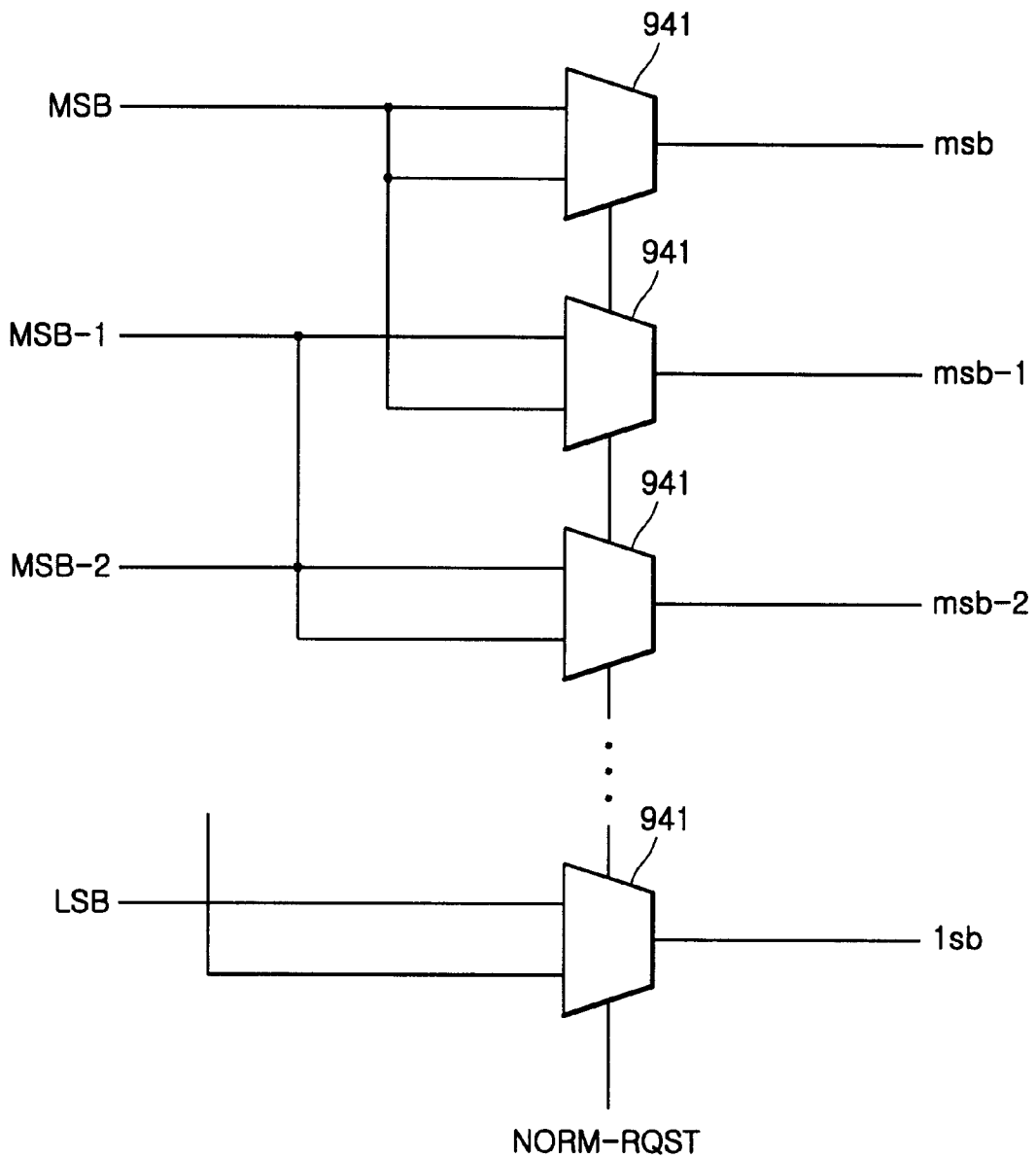
FIG. 10 illustrates a multiplexer used in the present invention.

FIG. 10 illustrates an example of a multiplexer 941 used in the present invention, and the multiplexer 941 carries out a normalization of "divided by 2 (1 bit shift left)". Outputs 1sb, ... msb-1, msb of the multiplexer device 94 are decided in accordance with outputs of the normalization demanding device so as to be inputted into the state value storing device 95.

The state value storing device 95 includes 6-bit registers as many as the number of the states, and depending on the application, the size of the registers can be adjusted. The state value storing device 95 stores the state values of the multiplexer device 94, and the output of the state value storing device 95 is supplied to the ACS arithmetic unit 93 so as to be used in computing the survivor state values and the survivor path information of the respective states.

The normalization demanding device 96 discriminates as to whether the maximum value of the state value data of the state value storing device 95 exceeds a predetermined threshold value, and the result is outputted to the multiplexer device 94. In the case where the size of the registers constituting the state value storing device 95 is 6 bits, and where the threshold value for discriminating the existence or absence of the normalization demanding is 31, the one upper bit of the respective registers of the state value storing device 95 is used in detecting as to whether there is a normalization demand. In the case where the threshold value is 47, the upper 2 bits are used in detecting as to whether there is a normalization demand.

The traceback device 97 includes: a path storing device for storing the survivor path information of the ACS arithmetic unit 93; and a traceback control device for controlling the traceback. The decoded data, i.e., the results of the traceback are outputted through an output terminal 98. The traceback device 97 further includes a maximum branch metric value detecting device which executes a traceback operation starting from a state having the maximum branch metric value survivor state value.

In the present invention, the normalization of the "divided by 2 (1 bit shift left)" is carried out, the lower 1 bit information of the arithmetic result is discarded. By discarding the lower 1 bit information of the result of the arithmetic operation, the error correcting performance of the Viterbi decoder can be lowered.

In order to minimize such a lowering of the performance, the frequency of the execution of the normalization should be reduced, so that the frequency of discarding the lower bit would be minimized. If the frequency of the execution of the normalization is to be reduced, the increase rate of the state values has to be minimized, and therefore, the operation result of the branch metric arithmetic unit is not directly supplied to the ACS arithmetic unit, but the normalized result of the branch metrics is inputted into the ACS arithmetic unit. The relative values are important in the ACS arithmetic unit, and therefore, even if the normalized result of the branch metrics is used, the error correcting capability of the Viterbi decoder is not affected.

Figure 11:
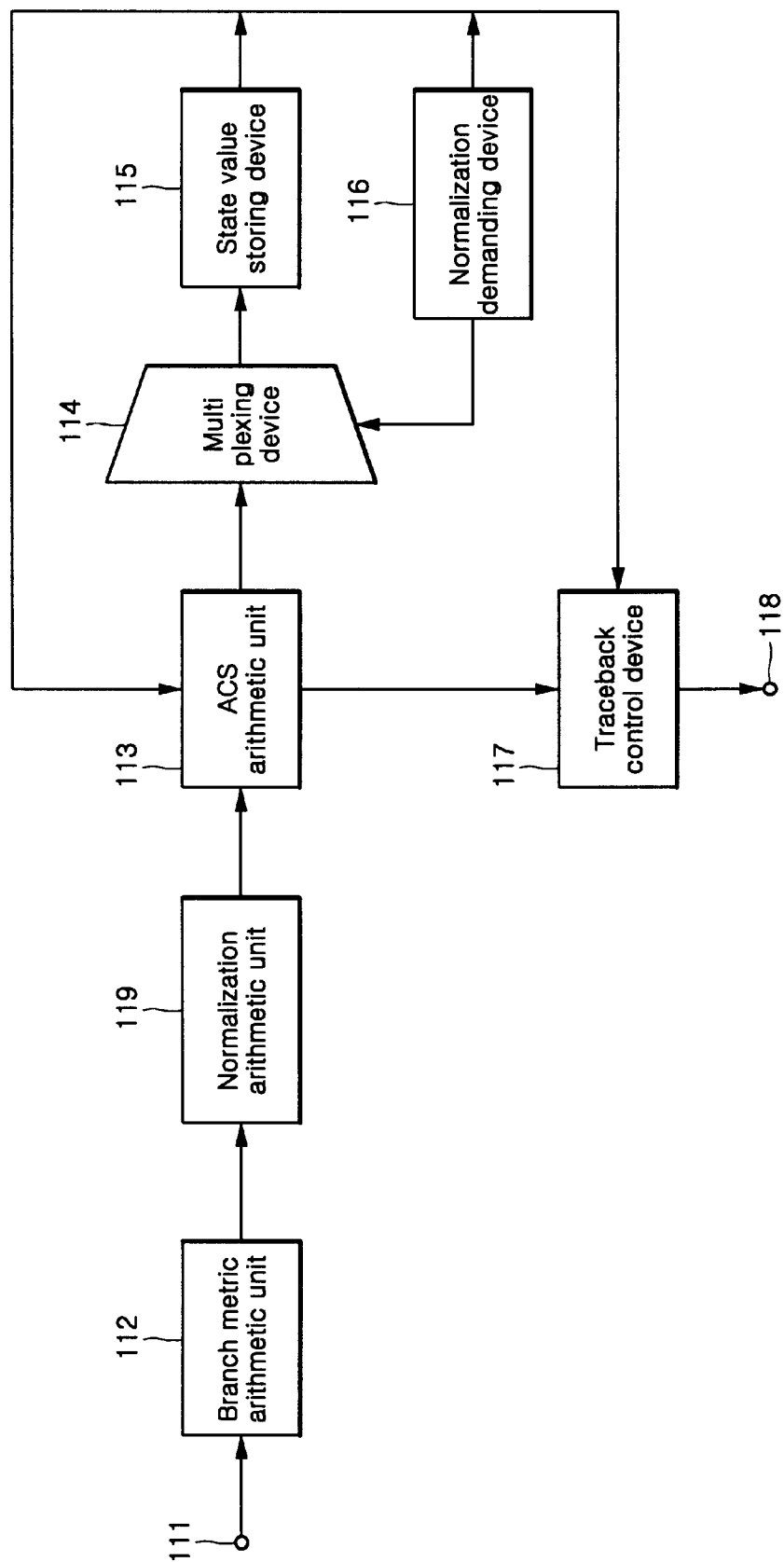
FIG. 11 illustrates still another embodiment of the present invention in which a branch metric normalization arithmetic unit is disposed between a branch metric arithmetic unit and an ACS arithmetic unit.

FIG. 11 illustrates still another embodiment of the present invention in which a branch metric normalization arithmetic unit is disposed between a branch metric arithmetic unit and an ACS arithmetic unit.

The normalization of the branch metrics is carried out in such a manner that the minimum value is detected from the branch metrics, and the minimum value thus detected is subtracted from the branch metrics.

According to the method of this embodiment, the method that the arithmetic operation is carried out by subtracting a predetermined threshold value from the survivor state values is not used, but the survivor state values are normalized by dividing them by 2, with the result that the operating speed of the Viterbi decoder is improved. The "divided by 2" arithmetic operation is carried out by using the structure of the multiplexer of FIG. 11. Thus a separate logic circuit is not necessary in carrying out the normalization, and therefore, the operating speed can be improved as much as the delay of the arithmetic operation of the normalization arithmetic unit.

In the case where a code synchronization is established between the transmitting part and the receiving part, and where there is no noise, if convolution-encoded received codes are decoded by using the Viterbi algorithm, the minimum state value and the minimum branch metric are always same, and therefore, the result is "0".

The probability that a state has the minimum value at a time t−1 by which a traceback can be made by using the survivor path information from a state having the minimum state value at an arbitrary time t becomes larger, as the signal-to-noise ratio is higher if the synchronization is established. This probability is larger in the case where the synchronization is not established than the case where the synchronization is established.

The method for detecting the synchronization/non-synchronization which is proposed in the present invention is carried out in the following manner. That is, an observation is made for a certain period of time as to whether a state having the minimum state value at the immediately preceding time is the state which is back-traceable from a state having the minimum state value at the current time by utilizing the survivor path information, thereby detecting the synchronization/non-synchronization.

If a state having the minimum state value at the immediately preceding time is back-traceable from a state having the minimum state value at the current time by utilizing the survivor path information, it is called "correspondent". On the other hand, if the traceback is impossible, then it is said that a non-correspondence has happened. Thus, the number of occurrences of the correspondence and non-correspondence is measured for a certain period of time, and the result is compared with a predetermined reference value, thereby deciding the synchronization/non-synchronization.

Figure 12:
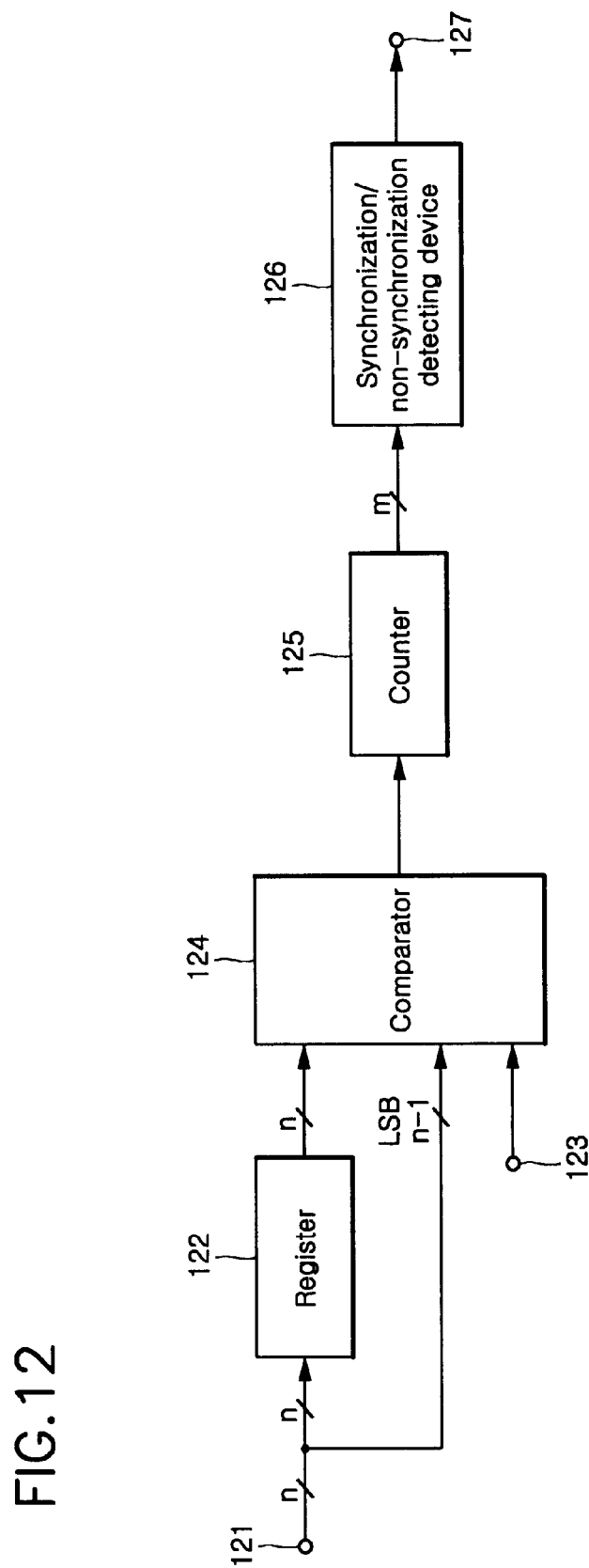
FIG. 12 illustrates an embodiment of a synchronization/non-synchronization detecting device for the Viterbi decoder according to the present invention.

FIG. 12 illustrates an embodiment of a synchronization/non-synchronization detecting device for the Viterbi decoder according to the present invention;

The bit address information of a state having the minimum state value at the current time is inputted through an input terminal 121 to both a register 122 and to a comparator 124. The register 122 is for storing the address information of the state having the minimum value at the immediately preceding time, and has a certain bit size. Therefore it stores the bit address information (inputted through the input terminal 121) for using it at the next period.

The comparator 124 receives: the address information bits of a state having the minimum state value at the preceding time; the lower n−1 bits of the address information of a state having the minimum state value at the current time (and inputted through the input terminal 121); and the survivor path information inputted through an input terminal 123, to compare them for detecting the existence or absence of non-correspondence. The compared result is outputted to a counter 125.

The counter 125 receives the signals from the comparator 124, and only when a non-correspondence is found, the value of the count is incremented. The counter counts the number of occurrences of non-correspondences for a certain period of time, and at each of certain intervals, the value of the counter is initialized to "0".

A synchronization/non-synchronization detecting device 126 detects the synchronization/non-synchronization by comparing the number of occurrences of the non-correspondences during a certain period of time.

There is another embodiment of the synchronization/non-synchronization detecting device according to the present invention. In this embodiment, without utilizing the survivor path information, an observation is made for a certain period of time as to whether a state having the minimum state value at the immediately preceding time is backtraceable from a state having the minimum state value at the current time, thereby detecting the synchronization/non-synchronization.

Figure 13:
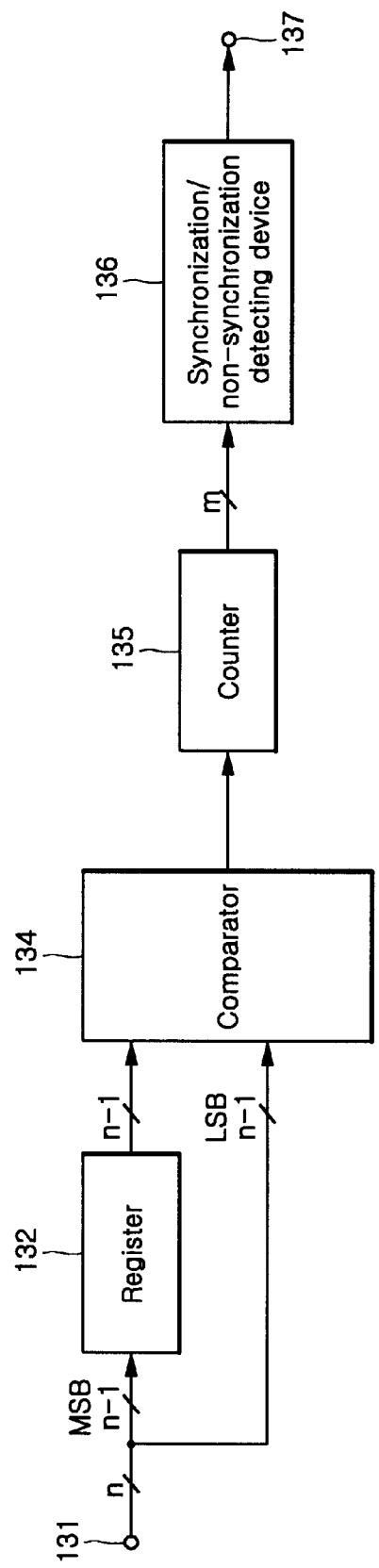
FIG. 13 illustrates another embodiment of a synchronization/non-synchronization detecting device for the Viterbi decoder according to the present invention.

FIG. 13 illustrates another embodiment of a synchronization/non-synchronization detecting device for the Viterbi decoder according to the present invention.

The n-bit address information of a state having the minimum state value at the current time is supplied through an input terminal 131 to both a register 132 and to a comparator 134. The register 132 is for storing the address information of the state having the minimum value at the immediately preceding time, and has an n-1-bit size. Therefore it stores the upper n-1 bits of the n-bit address information (inputted through the input terminal 131) for using it at the next period.

The comparator 134 receives: the upper n-1 bits of the address information bits of a state having the minimum state value at the preceding time; and the lower n-1 bits of the address information of a state having the minimum state value at the current time (and inputted through the input terminal 131), to compare them for detecting the existence or absence of non-correspondence. The compared result is outputted to a counter 135.

The counter 135 receives the signals from the comparator 134, and only when a non-correspondence is found, the value of the count is incremented. The counter counts the number of occurrences of non-correspondences for a certain period of time, and at each of certain intervals, the value of the counter is initialized to "0".

A synchronization/non-synchronization detecting device 136 receives the counted values of the counter 135 to compare the number of occurrences of the non-correspondences with a predetermined reference value, thereby detecting the synchronization/non-synchronization.

In the application field using the puncturing convolution encoding technique, in the case where there is established a puncture pattern synchronization between the transmitting part and the receiving part, and in the case where the convolution encoded received codes are decoded under a non-noise environment by using the Viterbi algorithm, the minimum state value and the minimum branch metric are always same, and the value is "0".

The probability that a state has the minimum value at a time t-1 by which a traceback can be made by using the survivor path information from a state having the minimum state value at an arbitrary time t becomes larger, as the signal-to-noise ratio is higher if the synchronization is established. This probability is larger in the case where the synchronization is established than the case where the synchronization is not established.

Therefore, an observation is made as to whether a state having the minimum state value at the immediately preceding time corresponds with a state which can be obtained by back-tracing from a state having the minimum value at the current time. In this manner, the synchronization/non-synchronization of the puncture pattern can be detected.

The method for detecting the puncture pattern synchronization/non-synchronization which is proposed in the present invention is carried out in the following manner. That is, an observation is made for a certain period of time as to whether a state having the minimum state value at the immediately preceding time is the state which is back-traceable from a state having the minimum state value at the current time by utilizing the survivor path information, thereby detecting the synchronization/non-synchronization.

If a state having the minimum state value at the immediately preceding time is back-traceable from a state having the minimum state value at the current time by utilizing the survivor path information, it is called "correspondence". On the other hand, if the traceback is impossible, then it is said that a non-correspondence has happened. Thus, the number of occurrences of the correspondence and non-correspondence is measured for a certain period of time, and the result is compared with a predetermined reference value, thereby deciding the synchronization/non-synchronization.

In a convolution encoder having an encoding rate of R=1/2, if the size (governing field (k)-1) of the register used is n, a state Si(t) having the minimum state value at a time t and a state Sj(t-1) having the minimum value at a time t-1 can be arranged in bit rows as follows:

Si(t)=bn bn-1 . . . B1B0

Sj(t-1)=bn' bn-1' . . . b1'b0'

Further an arbitrary state Sh(t-1) at a time t-1 which can be obtained by backtracing from the state Si(t) by utilizing the survivor path information X of the state Si(t) can be expressed in bit rows as follows:

Sh(t-1)=bn-1 bn-2 . . . b1X

Whether the state Sj(t-1) having the minimum state value at a time t-1 corresponds with a state which can be obtained by backtracing from the state Si(t) having the minimum state value at a time t by utilizing the survivor path information is judged by comparing the n bits of Sh(t-1) with the n bits of Sj(t-1).

Figure 14:
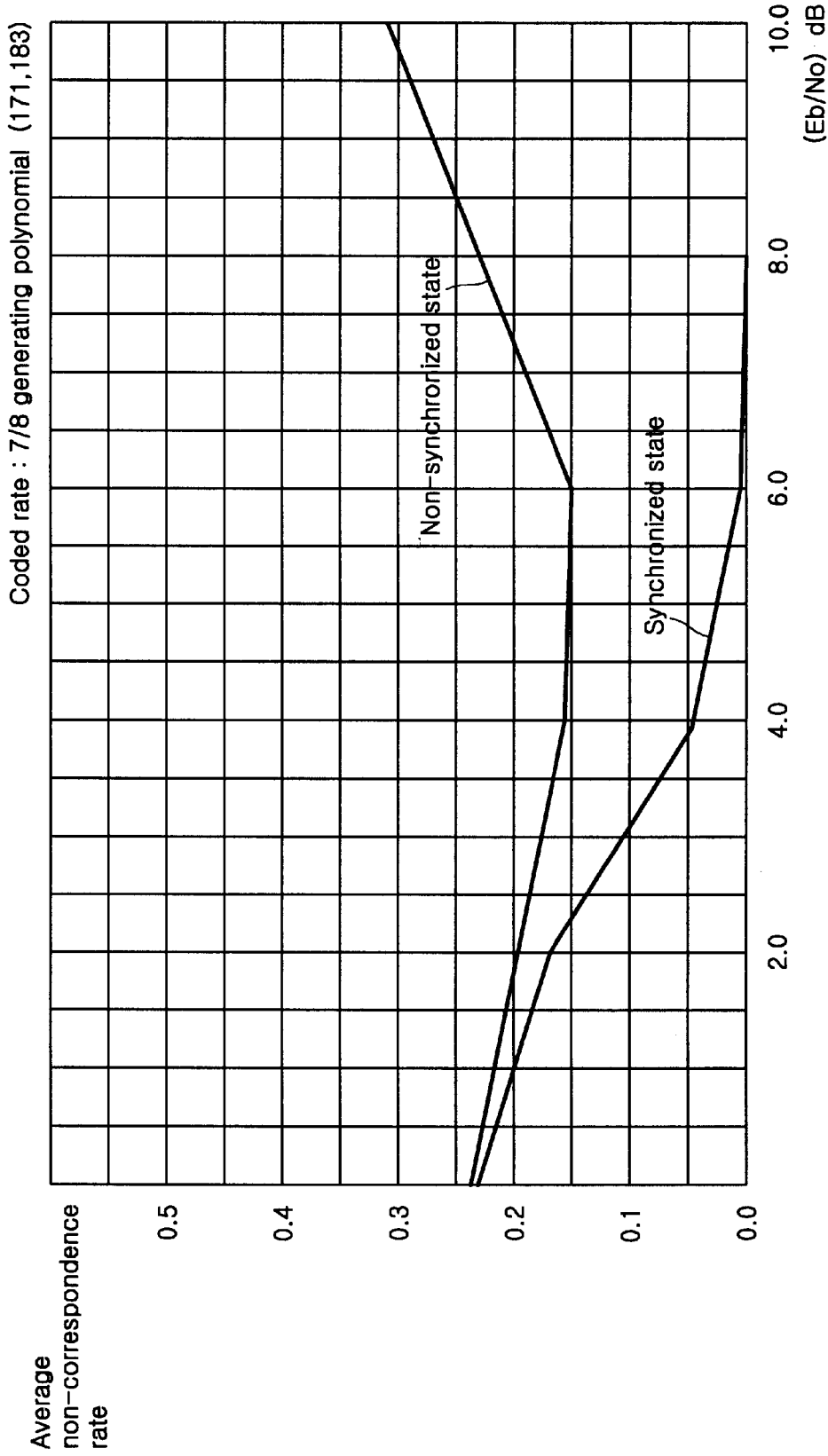
FIG. 14 is a graphical illustration showing the average non-correspondence rate versus the signal-to-noise ratio (Eb/No) during the puncture pattern synchronization/non-synchronization, with a puncturing convolution encoder having a code rate R=7/8 and a generating polynomial 171, 133 being used.

FIG. 14 is a graphical illustration showing the average non-correspondence rate versus the signal-to-noise ratio (Eb/No) during the puncture pattern synchronization/non-synchronization, with a puncturing convolution encoder having a code rate R=7/8, and a generating polynomial 171, 133 being used.

Due to the characteristics below the signal-to-noise ratio of 3.0 dB, it is impossible to set a reference value which can detect the puncture pattern synchronization/non-synchronization regardless of the signal-to-noise ratio. However, under an environment of above 4.0 dB, it is possible to set a reference value which can detect the puncture pattern synchronization/non-synchronization regardless of the signal-to-noise ratio.

Figure 15:
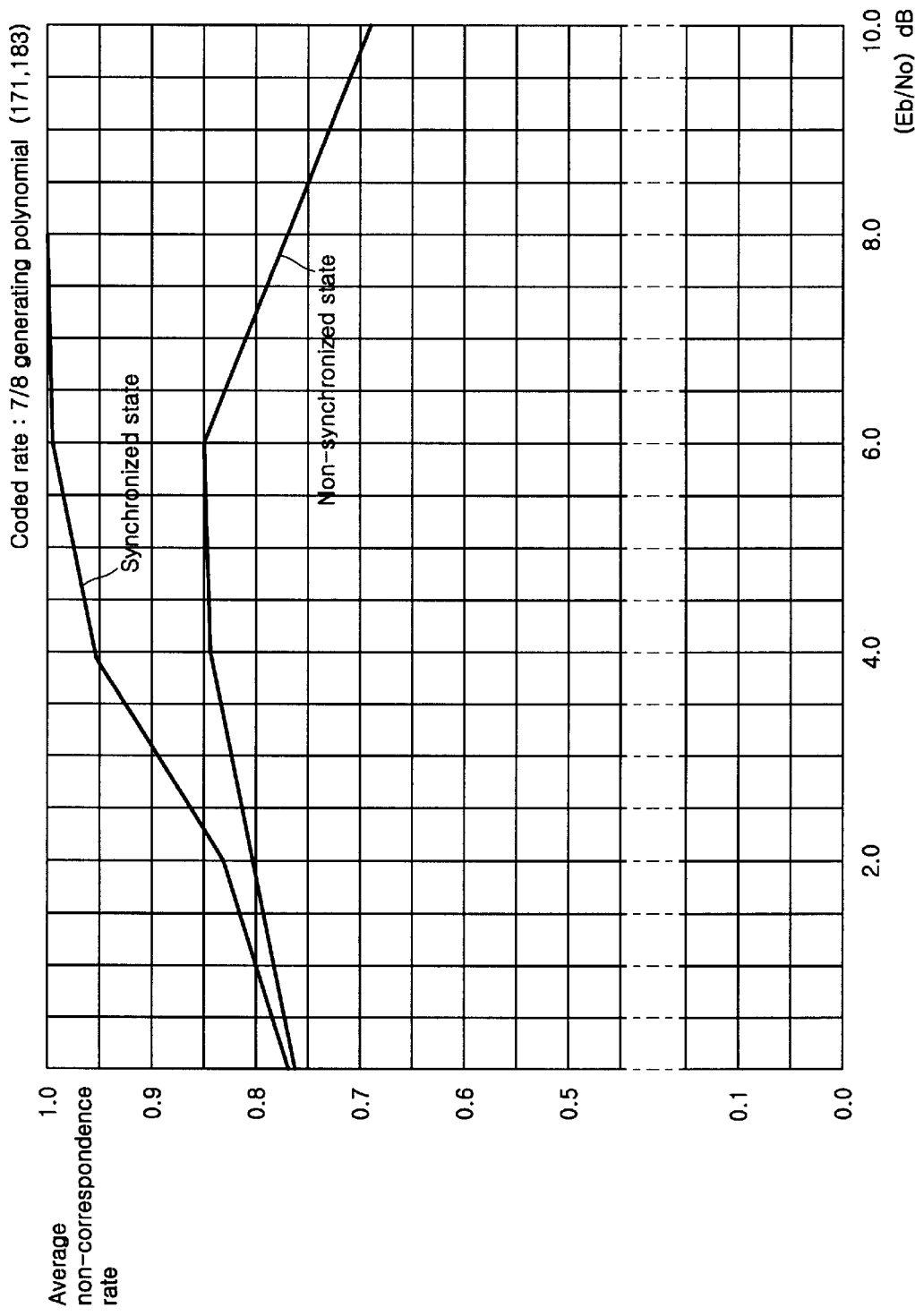
FIG. 15 is a graphical illustration showing the average correspondence rate versus the signal-to-noise ratio (Eb/No) during the puncture pattern synchronization/non-synchronization, with a puncturing convolution encoder having a code rate R=7/8 and a generating polynomial 171, 133 being used.

FIG. 15 is a graphical illustration showing the average correspondence rate versus the signal-to-noise ratio (Eb/No) during the puncture pattern synchronization/non-synchronization, with a puncturing convolution encoder having a code rate R=7/8, and a generating polynomial 171, 133 being used. Under an environment of above 4.0 dB, it is possible to set a reference value which can detect the puncture pattern synchronization/non-synchronization regardless of the signal-to-noise ratio.

Between the synchronization/non-synchronization detecting reference value and the average value at the synchronization and the average value at the non-synchronization, there is no sufficient margin. Therefore it cannot be excluded that an erroneous detection occurs or the detection time is extended. In order to increase such a margin, the number of occurrences of non-correspondence is measured only when the puncture pattern is Xi=Yi=1. Or when Xi=Yi=1, a certain amount of weight value is added so as to increase the margin.

Figure 16:
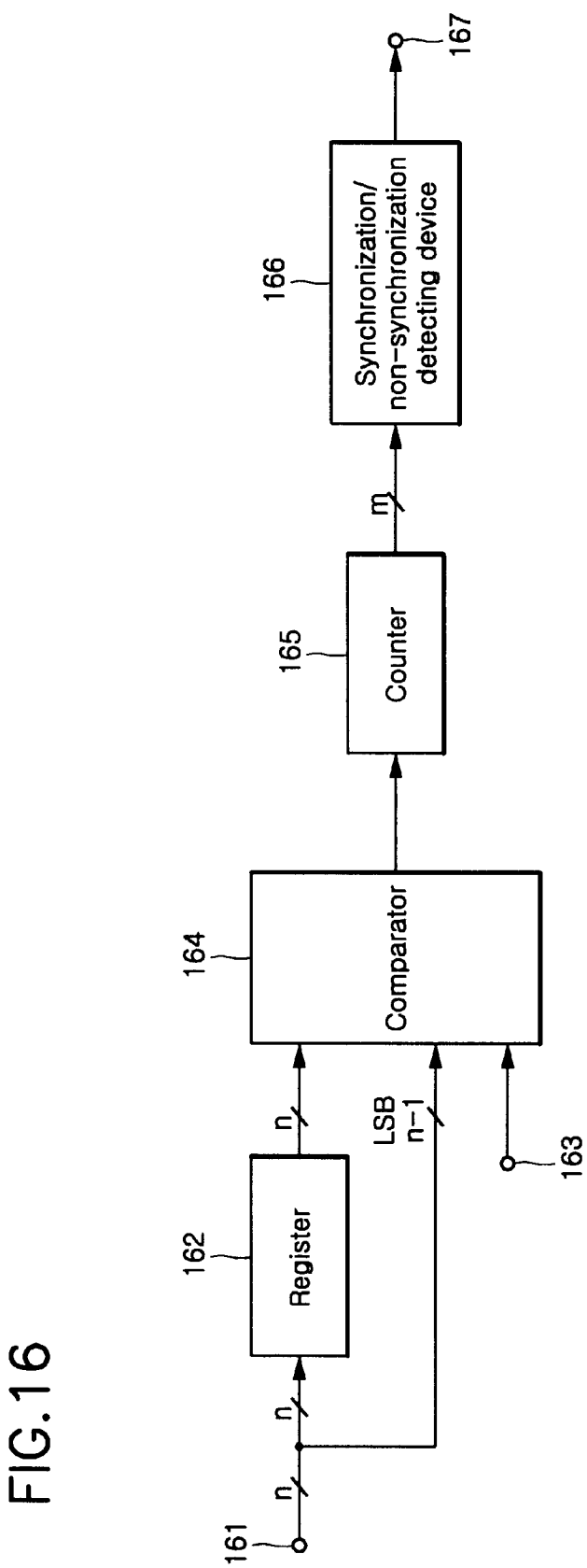
FIG. 16 illustrates an embodiment of the puncture pattern synchronization/non-synchronization detecting device for the Viterbi decoder according to the present invention.

FIG. 16 illustrates an embodiment of the puncture pattern synchronization/non-synchronization detecting device for the Viterbi decoder according to the present invention.

The n-bit address information of a state having the minimum state value at the current time is inputted through an input terminal 161 to both a register 162 and to a comparator 164. The register 162 is for storing the address information of the state having the minimum value at the immediately preceding time, and has an n-bit size. Therefore it stores the bit address information (inputted through the input terminal 161) for using it at the next period.

The comparator 164 receives: the n-bit address information of a state having the minimum state value at the preceding time; the lower n−1 bits of the address information of a state having the minimum state value at the current time (and inputted through the input terminal 161); and the survivor path information inputted through an input terminal 163, to compare them for detecting the existence or absence of non-correspondence. The compared result is outputted to a counter 165.

The counter 165 receives the signals from the comparator 164, and only when a non-correspondence is found, the value of the count is incremented. The counter counts the number of occurrences of non-correspondences for a certain period of time, and at each of certain intervals, the value of the counter is initialized.

A synchronization/non-synchronization detecting device 166 receives the counted bit values, i.e., the number of occurrences of the non-correspondences during a certain period of time from the counter 165, and detects the puncture pattern synchronization/non-synchronization by comparing the inputted counted value with a reference value for synchronization/non-synchronization.

Further, without utilizing the survivor path information, an observation is made for a certain period of time as to whether a state having the minimum state value at the immediately preceding time is backtraceable from a state having the minimum state value at the current time, thereby detecting the synchronization/non-synchronization.

If a state having the minimum state value at the immediately preceding time is back-traceable from a state having the minimum state value at the current time by utilizing the survivor path information, it is called "correspondence". On the other hand, if the traceback is impossible, then it is said that a non-correspondence has happened. Thus, the number of occurrences of the correspondence and non-correspondence is measured for a certain period of time, and the result is compared with a predetermined reference value, thereby deciding the puncture pattern synchronization/non-synchronization.

Figure 17:
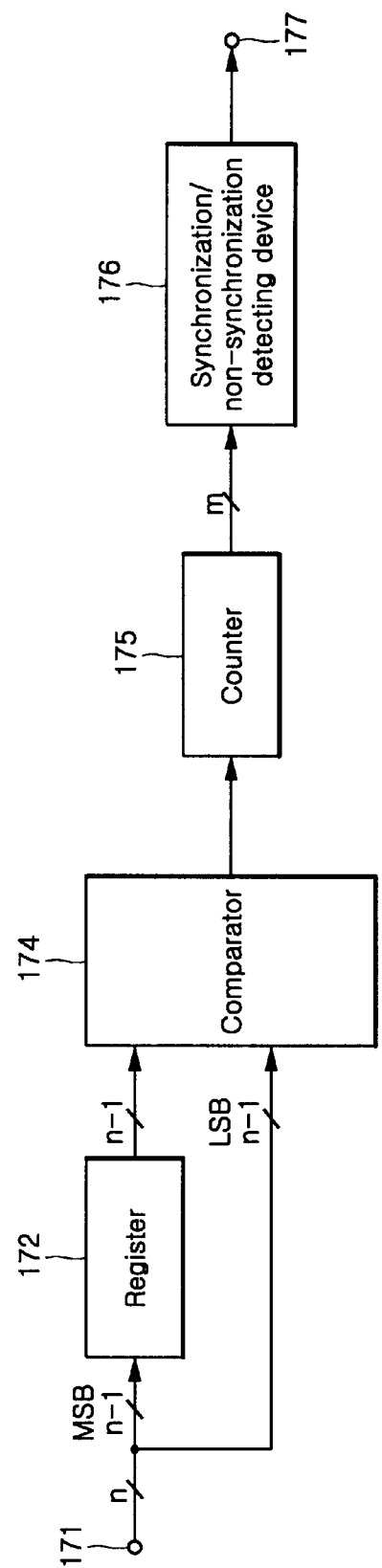
FIG. 17 illustrates another embodiment of the puncture pattern synchronization/non-synchronization detecting device for the Viterbi decoder according to the present invention.

FIG. 17 illustrates another embodiment of the puncture pattern synchronization/non-synchronization detecting device for the Viterbi decoder according to the present invention.

The n-bit address information of a state having the minimum state value at the current time is inputted through an input terminal 171 to both a register 172 and to a comparator 174. The register 172 is for storing the address information of the state having the minimum value at the immediately preceding time, and has a size of n−1 bits. Therefore it stores the n−1-bit address information (inputted through the input terminal 171) for using it at the next period.

The comparator 174 receives: the n−1 bits of the address information of a state having the minimum state value at the preceding time (inputted from the register 172); and the lower n−1 bits of the address information of a state having the minimum state value at the current time (inputted through the input terminal 171), to compare them for detecting the existence or absence of non-correspondence. The compared result is outputted to a counter 175.

The counter 175 receives the signals from the comparator 174, and only when a non-correspondence is found, the value of the count is incremented. The counter counts the number of occurrences of non-correspondences for a certain period of time, and at each of certain intervals, the value of the counter is initialized "0".

A synchronization/non-synchronization detecting device 176 receives the counted bit values, i.e., the number of occurrences of the non-correspondences during a certain period of time from the counter 175, and detects the puncture pattern synchronization/non-synchronization by comparing the inputted counted value with a reference value for synchronization/non-synchronization.

According to the present invention as described above, the operating speed of the Viterbi decoder can be improved in the application fields using the convolution encoding technique. Further, with a minimum hardware cost, the synchronization/non-synchronization can be detected.

What is claimed is:

1. A method for detecting synchronization/non-synchronization by a Viterbi decoder, comprising the steps of:

judging as to whether a state having the minimum state value at an immediately preceding time corresponds with a state obtained by backtracing from a state having the minimum value at the current time by utilizing a survivor path information;

measuring the number of occurrences of non-correspondence that a state having the minimum state value at an immediately preceding time cannot be traced back from a state having the minimum state value at the current time by utilizing a survivor path information; and comparing the number of occurrences of non-correspondence with a reference value.

2. A synchronization/non-synchronization detecting device for a Viterbi decoder, comprising:

a register having a size of n bits, for storing an address information of a state having the minimum state value at an immediately preceding time;

a comparator for receiving from said register: upper n bits of a state having the minimum state value at a preceding time; lower n−1 bits of an address information of a state having the minimum state value at the current time; and survivor path information, so as to judge on non-correspondences;

a counter for receiving signals from said comparator so as to increment the counted value only upon encountering a non-correspondence; and a synchronization/non-synchronization detector for receiving the counted number of non-correspondences (occurred within a certain period of time) from said counter, to compare it with a predetermined reference value so as to detect a synchronization/non-synchronization.

3. The synchronization/non-synchronization detecting device as claimed in claim 2, wherein said counter counts the number of occurrences of non-correspondence for a predetermined period of time, and initialize the counting value at every predetermined period.

4. A method for detecting synchronization/non-synchronization in a Viterbi decoder, comprising the steps of:

observing as to whether a state having the minimum state value at an immediately preceding time corresponds with a state obtained by tracing back from a state having the minimum state value at the current time by utilizing a survivor path information;

judging on non-correspondence that a state having the minimum state value at an immediately preceding time cannot be traced back from a state having the minimum state value at the current time by utilizing a survivor path information;

measuring the number of occurrences of non-correspondence only if a puncture pattern is $Xi=Yi=1$; and comparing the number of occurrences of non-correspondence with a reference value.

5. The method as claimed in claim 4, wherein the step of measuring the number of occurrences of non-correspondence includes a sub-step of adding a weight to the number of occurrences of non-correspondence if a puncture pattern is $Xi=Yi=1$.

6. The method as claimed in any one of claims 4 and 5, wherein, at the step of judging as to whether a state having the minimum state value at an immediately preceding time cannot be backtraced from a state having the minimum value at the current time, the non-correspondence is judged by comparing upper n−1 bits of an address information of a state having the minimum value at an immediately preceding time with lower n−1 bits of an address information of a state having the minimum value at the current time, and a register of a convolution encoder has a size of n(K (governing field)−1).

* * * * *